US 6,697,985 B1

United States Patent
Ilani (10) Patent No.: US 6,697,985 B1
(45) Date of Patent: Feb. 24, 2004

(54) PREDICTIVE FORWARD ERROR CORRECTION REDUNDANCY

(75) Inventor: Ishai Ilani, Modiin (IL)

(73) Assignee: Actelis Networks Inc., Fremont, CA (US)

(*) Notice: Subject to any disclaimer, the term of this patent is extended or adjusted under 35 U.S.C. 154(b) by 423 days.

(21) Appl. No.: 09/677,671

(22) Filed: Oct. 4, 2000

(51) Int. Cl.[7] .................... H03M 13/00; H04L 1/18
(52) U.S. Cl. ........................... 714/751; 714/786
(58) Field of Search ........................... 714/794, 792, 714/786, 756, 746, 755, 752, 751, 780, 769, 796, 793; 375/346, 240, 26

(56) References Cited

U.S. PATENT DOCUMENTS

| | | | | |
|---|---|---|---|---|
| 4,649,541 A | * | 3/1987 | Lahmeyer ................... | 714/784 |
| 5,107,503 A | * | 4/1992 | Riggle et al. ................ | 714/784 |
| 5,373,511 A | * | 12/1994 | Veksler ....................... | 714/755 |
| 5,457,704 A | * | 10/1995 | Hoeher et al. ............... | 714/794 |
| 5,719,884 A | * | 2/1998 | Roth et al. .................. | 714/755 |
| 6,023,783 A | * | 2/2000 | Divsalar et al. ............. | 714/792 |
| 6,192,503 B1 | * | 2/2001 | Chennakeshu et al. ...... | 714/796 |
| 6,304,995 B1 | * | 10/2001 | Smith et al. ................. | 714/786 |
| 6,415,413 B1 | * | 7/2002 | Pan et al. .................... | 714/784 |

\* cited by examiner

Primary Examiner—Albert Decady
Assistant Examiner—Mujtaba Chaudry
(74) Attorney, Agent, or Firm—Eitan, Pearl, Latzer & Cohen Zedek, LLP (57) ABSTRACT

A forward error correction system including a coder operative to encode a data stream into at least one primary code word and at least one secondary code word, where each primary code word is encoded at a first code rate, and each secondary code word is encoded at a second code rate that is greater than the first code rate, at least one transmitting modem for transmitting the code words, at least one receiving modem for receiving the code words, a decoder operative to detect errors in any of the code words, correct any of the errors and erasures in the code words, and communicate the positions of any of the errors, and a controller operative to receive the communication of the error positions, predict from any of the errors in the primary code word at least one error in the secondary code word, and report any of the predicted errors as erasure positions to the decoder.

37 Claims, 5 Drawing Sheets

PREDICTIVE FORWARD ERROR CORRECTION REDUNDANCY

FIELD OF THE INVENTION

The present invention relates to data telecommunications in general, and more particularly to forward error correction therefor.

BACKGROUND OF THE INVENTION

The use of Forward Error Correction (FEC) techniques in the design of digital communications and storage systems is well known. FEC is used to find and correct limited errors caused by a transport or storage system in order to ensure the validity of the received message without requiring retransmissions. In general, FEC encoding techniques, such as Reed-Solomon (RS) encoding, provide data redundancy by adding extra code symbols to a transmitted message which provide the necessary detection and correction information. The number of redundant symbols is determined by the amount and type of error correction required. RS encoding is an example of a block code where the data to be transmitted are divided into blocks, with each block comprising k symbols of data. An additional r redundancy symbols are then added to each block of k data symbols to form a code word of length n=k+r. The "code rate" of the code refers to the ratio k/n, and is used to express the average amount of data symbols versus the amount of transmitted symbols. Thus, a code rate of 0.8 would indicate that the average over all time intervals T of the ratio of data symbols that were encoded in time interval T to the total number of transmitted symbols in time interval T, is 80%.

In general, the additional redundancy symbols must contain enough information to allow the position of an erroneous information symbol to be located and its value determined. For example, an RS decoder can detect and correct up to r/2 incorrect symbols if there are (r=n−k) redundant symbols in each code word, as one redundant symbol is used to detect and locate each error, and one more redundant symbol is used to identify the precise value of that error. Some symbols that are either known or suspected to be in error or otherwise unreliable may be labeled as "erasures." The position of each erasure may be provided in advance to the decoder which then ignores the actual value of the erasure and instead reconstructs its value using the redundancy symbols. Since the position of each erasure is known, only one redundant symbol is needed to reconstruct the value of an erasure, and an additional redundant symbol to determine the location of the erasure is not required. In general, if a code word contains E symbols that are erasures whose locations are known and e symbols that are errors with unknown locations, the code word can be correctly decoded provided that (2e+E)<r. If the locations of all the errors are known to the decoder, the message can be correctly decoded provided that E<r, thus requiring half the number of redundant symbols needed to correct errors whose locations are not known.

While conventional FEC techniques may be used more or less successfully to correct errors, they generally must be designed with a redundancy that is greater than the number of errors they are expected to correct, with RS codes requiring up to twice as many redundancy symbols as error symbols. Thus, the greater the redundancy, the less room there is for data in each code word and the less throughput of the communication channel due to error correction overhead.

SUMMARY OF THE INVENTION

In one aspect of the present invention a forward error correction system is provided including a coder operative to encode a data stream into at least one primary code word and at least one secondary code word, where each primary code word is encoded at a first code rate, and each secondary code word is encoded at a second code rate that is greater than the first code rate, at least one transmitting modem for transmitting the code words, at least one receiving modem for receiving the code words, a decoder operative to detect errors in any of the code words, correct any of the errors and erasures in the code words, and communicate the positions of any of the errors, and a controller operative to receive the communication of the error positions, predict from any of the errors in the primary code word at least one error in the secondary code word, and report any of the predicted errors as erasure positions to the decoder.

In another aspect of the present invention the controller is operative to predict after determining that the number of errors detected in the primary code word exceeds a predetermined error threshold.

In another aspect of the present invention the coder is a Reed-Solomon coder.

In another aspect of the present invention the code words are either of systematic, non-systematic, and convolutional code words.

In another aspect of the present invention the code words are of different lengths.

In another aspect of the present invention the at least one transmitting modem includes a plurality of transmitting modems, and the system further includes a demultiplexer for demultiplexing the code words, thereby causing each of the transmitting modems to transmit a different portion of each of the code words.

In another aspect of the present invention the at least one receiving modem includes a plurality of receiving modems for receiving the different portions of each of the code words, and the system further includes a multiplexer for multiplexing the portions, thereby reconstructing the code words.

In another aspect of the present invention the controller is operative to predict after determining that the number of errors detected in any of the portions exceeds the predetermined error threshold, and any of the predicted errors corresponds to the portion exceeding the predetermined error threshold.

In another aspect of the present invention the system further includes an interleaver for interleaving the code words, and a deinterleaver for deinterleaving the interleaved code words.

In another aspect of the present invention the controller is operative to send a configuration signal to the decoder configuring the decoder for decoding either of the primary and the secondary code words.

In another aspect of the present invention a forward error correction system is provided including a coder operative to encode a data stream into at least one primary code word and at least one secondary code word, where each primary code word is encoded at a first code rate, and each secondary code word is encoded at a second code rate that is greater than the first code rate, a demultiplexer for demultiplexing each of the code words into a plurality of portions, a plurality of transmitting modems, each transmitting modem for transmitting a different one of the plurality of portions, a plurality of receiving modems for receiving the plurality of portions, a multiplexer for multiplexing the plurality of portions, thereby reconstructing the code words, a primary decoder operative to detect any errors in any of the primary code words, correct any of the errors, and communicate the positions of any of the errors, a controller operative to receive the communication of the error positions, predict from any of the errors in the primary code word at least one error in the secondary code word, and report any of the predicted errors as erasure positions, a secondary decoder operative to receive the report of erasure positions and correct any of the erasures in the secondary code words.

In another aspect of the present invention the controller is operative to predict after determining that the number of errors detected in the primary code word exceeds a predetermined error threshold.

In another aspect of the present invention the controller is operative to predict after determining that the number of errors detected in any of the portions exceeds the predetermined error threshold, and any of the predicted errors corresponds to the portion exceeding the predetermined error threshold.

In another aspect of the present invention the coder is a Reed-Solomon coder.

In another aspect of the present invention the code words are either of systematic, non-systematic, and convolutional code words.

In another aspect of the present invention the code words are of different lengths.

In another aspect of the present invention the system further includes an interleaver for interleaving the code words, and a deinterleaver for deinterleaving the interleaved code words.

In another aspect of the present invention a forward error correction system is provided including a coder operative to encode a data stream into at least one code word at a first code rate, a demultiplexer for demultiplexing the code word into a plurality of portions, a plurality of transmitting modems, each transmitting modem for transmitting a different one of the plurality of portions, a plurality of receiving modems for receiving the plurality of portions, where any of the modems is operative to determine its function status and transmit a signal indicating the status, a multiplexer for multiplexing the plurality of portions, thereby reconstructing the code word, a decoder operative to detect any errors in the code word, correct any of the errors, and correct erasures, and a controller operative to receive the signal and, where the signal indicates that any of the modems is functioning improperly, report erasure positions corresponding to the portion transmitted by the improperly functioning modem to the decoder, where the decoder is operative to receive the report of erasure positions and correct any of the erasures in any of the code words.

In another aspect of the present invention the controller is operative to instruct either of the encoder and the decoder to encode at a second code rate having a sufficient redundancy to accommodate the number of the errors and erasures.

In another aspect of the present invention a forward error correction system is provided including an outer coder operative to encode a data stream into at least one outer code word, an inner coder operative to encode the outer code word into at least one inner code word using either of an error correcting code and an error checking code, a communications channel for transmitting the inner code word, an inner decoder operative to receive the transmitted inner code word from the communications channel, determine the validity of the inner code word, communicate the validity of the inner code word, and decode the inner code word, thereby reconstituting the outer code word, a controller operative to receive from the inner coder the communication of validity of the inner code word, map the inner code word to its corresponding position in the reconstituted outer code word, and, where the inner code word is invalid, and report the position as an erasure position, and an outer decoder operative to receive the reconstituted outer code word from the inner decoder and the erasure positions from the inner decoder, detect errors in the reconstituted outer code word, and correct any of the errors and erasures in the reconstituted outer code word.

In another aspect of the present invention the outer coder is a Reed-Solomon coder and the outer decoder is a Reed-Solomon decoder.

In another aspect of the present invention the inner coder and the inner decoder employ Trellis Coded Modulation.

In another aspect of the present invention the inner coder and the inner decoder employ Cyclic Redundancy Checking.

In another aspect of the present invention the system further includes an interleaver for interleaving the code words, and a deinterleaver for deinterleaving the interleaved code words.

In another aspect of the present invention a forward error correction method is provided including encoding a data stream into at least one primary code word and at least one secondary code word, where each primary code word is encoded at a first code rate, and each secondary code word is encoded at a second code rate that is greater than the first code rate, transmitting the code words from a transmitting modem to a receiving modem, detecting any errors in any of the transmitted code words, predicting from any of the errors in the primary code word at least one error in the secondary code word, and reporting any of the predicted errors as erasure positions.

In another aspect of the present invention the predicting step includes predicting after determining that the number of errors detected in the primary code word exceeds a predetermined error threshold.

In another aspect of the present invention the transmitting step includes demultiplexing the code words into a plurality of code word portions, transmitting the portions via a plurality of transmitting modems, receiving the portions via a plurality of receiving modems, and multiplexing the plurality of portions, thereby reconstructing the code word.

In another aspect of the present invention the method further includes interleaving the code words prior to the transmitting step, and deinterleaving the interleaved code words subsequent to the transmitting step.

In another aspect of the present invention the method further includes configuring the decoder for decoding either of the primary and the secondary code words.

In another aspect of the present invention a forward error correction method is provided including encoding a data stream into at least one primary code word and at least one secondary code word, where each primary code word is encoded at a first code rate, and each secondary code word is encoded at a second code rate that is greater than the first code rate, demultiplexing each of the code words into a plurality of portions, transmitting a different one of the plurality of portions via a plurality of transmitting modems, receiving a different one of the plurality of portions via a plurality of receiving modems, multiplexing the plurality of portions, thereby reconstructing the code words, detecting any errors in any of the primary code words at a primary decoder, predicting from any of the errors in the primary code word at least one error in the secondary code word, reporting any of the predicted errors as erasure positions to a secondary decoder, and correcting any of the erasures in the secondary code words at the secondary encoder.

In another aspect of the present invention the predicting step includes predicting after determining that the number of errors detected in the primary code word exceeds a predetermined error threshold.

In another aspect of the present invention the predicting step includes predicting after determining that the number of errors detected in any of the portions exceeds a predetermined error threshold, and any of the predicted errors corresponds to the portion exceeding the predetermined error threshold.

In another aspect of the present invention the method further includes interleaving the code words prior to the demultiplexing step, and deinterleaving the interleaved code words subsequent to the multiplexing step.

In another aspect of the present invention a forward error correction method is provided including encoding a data stream into at least one code word at a first code rate, demultiplexing each of the code words into a plurality of portions, transmitting a different one of the plurality of portions via a plurality of transmitting modems, receiving a different one of the plurality of portions via a plurality of receiving modems, multiplexing the plurality of portions, thereby reconstructing the code words, determining the function status of any of the modems, and where any of the modems is functioning improperly, decoding as erasures the portion transmitted by the improperly functioning modem.

In another aspect of the present invention a forward error correction method is provided including firstly encoding a data stream into at least one outer code word, secondly encoding the outer code word into at least one inner code word using either of an error correcting code and an error checking code, transmitting the inner code word, receive the transmitted inner code word, determining the validity of the transmitted inner code word, firstly decoding the inner code word, thereby reconstituting the outer code word, mapping the inner code word to its corresponding position in the reconstituted outer code word, and where the inner code word is invalid, secondly decoding the reconstituted outer code word where the position is treated as an erasure position.

In another aspect of the present invention the firstly coding step includes coding using Reed-Solomon coding and the secondly decoding step includes decoding using Reed-Solomon decoding.

In another aspect of the present invention the secondly coding step includes coding using Trellis Coded Modulation coding and the firstly decoding step includes decoding using Trellis Coded Modulation decoding.

In another aspect of the present invention the secondly coding step includes coding using Cyclic Redundancy Check coding and the firstly decoding step includes decoding using Cyclic Redundancy Check decoding.

In another aspect of the present invention in a communications system including a data stream encoded into at least one primary code word and at least one secondary code word, where each primary code word is encoded at a first code rate, and each secondary code word is encoded at a second code rate that is greater than the first code rate, a forward error correction system is provided including a decoder operative to receive the code words, detect errors in any of the code words, correct any of the errors and erasures in the code words, and communicate the positions of any of the errors, and a controller operative to receive the communication of the error positions, predict from any of the errors in the primary code word at least one error in the secondary code word, and report any of the predicted errors as erasure positions to the decoder.

In another aspect of the present invention the system further includes a coder operative to encode the data stream.

In another aspect of the present invention the system further includes at least one transmitting modem for receiving the code words ultimately from the coder and transmitting the code words, and at least one receiving modem for receiving the code words from the at least one transmitting modem and for providing the code words ultimately to the decoder.

In another aspect of the present invention the controller is operative to predict after determining that the number of errors detected in the primary code word exceeds a predetermined error threshold.

In another aspect of the present invention the at least one transmitting modem includes a plurality of transmitting modems and the system further includes a demultiplexer intermediate the coder and the transmitting modems for demultiplexing the code words, thereby causing each of the transmitting modems to transit a different portion of each of the code words.

In another aspect of the present invention the at least one receiving modem includes a plurality of receiving modems for receiving the different portions of each of the code words and the system further includes a multiplexer intermediate the receiving modems and the decoder for multiplexing the portions, thereby reconstructing the code words.

In another aspect of the present invention the controller is operative to predict after determining the number of errors detected in any of the portions exceeds the predetermined error threshold, and any of the predicted errors corresponds to the portion exceeding the predetermined error threshold.

In another aspect of the present invention the system further includes an interleaver intermediate the coder and the at least one transmitting modem for interleaving the code words, and a deinterleaver intermediate the at least one receiving modem and the decoder for deinterleaving the interleaved code words.

In another aspect of the present invention the controller is operative to send a configuration signal to the decoder configuring the decoder for decoding either of the primary and the secondary code words.

In another aspect of the present invention in a communications system including a data stream encoded into at least one primary code word and at least one secondary code word, where each primary code word is encoded at a first code rate, and each secondary code word is encoded at a second code rate that is greater than the first code rate, a forward error correction system is provided including a primary decoder operative to receive the primary code words, detect any errors in any of the primary code words, correct any of the errors, and communicate the positions of any of the errors, a controller operative to receive the communication of the error positions, predict from any of the errors in the primary code word at least one error in the secondary code word, and report any of the predicted errors as erasure positions, and a secondary decoder operative to receive the report of erasure positions and correct any of the erasures in the secondary code words.

In another aspect of the present invention the system further includes a coder operative to encode the data stream.

In another aspect of the present invention the system further includes at least one transmitting modem for receiving the code words ultimately from the coder and transmitting the code words, and at least one receiving modem for receiving the code words from the at least one transmitting modem and for providing the code words ultimately to either of the decoders.

In another aspect of the present invention the controller is operative to predict after determining that the number of errors detected in the primary code word exceeds a predetermined error threshold.

In another aspect of the present invention the at least one transmitting modem includes a plurality of transmitting modems and the system further includes a demultiplexer intermediate the coder and the transmitting modems for demultiplexing the code words, thereby causing each of the transmitting modems to transmit a different portion of each of the code words.

In another aspect of the present invention the at least one receiving modem includes a plurality of receiving modems for receiving the different portions of each of the code words and the system further includes a multiplexer intermediate the receiving modems and the decoders for multiplexing the portions, thereby reconstructing the code words.

In another aspect of the present invention the controller is operative to predict after determining that the number of errors detected in any of the portions exceeds the predetermined error threshold, and any of the predicted errors corresponds to the portion exceeding the predetermined error threshold.

In another aspect of the present invention the system further includes an interleaver intermediate the coder and the at least one transmitting modem for interleaving the code words, and a deinterleaver intermediate the at least one receiving modem and the decoders for deinterleaving the interleaved code words.

In another aspect of the present invention in a communications system including a data stream encoded into at least one code word at a first code rate, the code word transmitted in a plurality of portions, a forward error correction system is provided including a plurality of receiving modems for receiving the plurality of portions, where any of the modems is operative to determine its function status and transmit a signal indicating the status, a multiplexer for multiplexing the plurality of portions, thereby reconstructing the code word, a decoder operative to detect any errors in the code word, correct any of the errors, and correct erasures, and a controller operative to receive the signal and, where the signal indicates that any of the modems is functioning improperly, report erasure positions corresponding to the portion transmitted by the improperly functioning modem to the decoder, where the decoder is operative to receive the report of erasure positions and correct any of the erasures in any of the code words.

In another aspect of the present invention the system further includes a coder operative to encode the data stream.

In another aspect of the present invention the controller is operative to instruct either of the encoder and the decoder to encode at a second code rate having a sufficient redundancy to accommodate the number of the errors and erasures.

In another aspect of the present invention the system further includes at least one transmitting modem for receiving the code words ultimately from the coder and transmitting the code words.

In another aspect of the present invention the controller is operative to predict after determining that the number of errors detected in the primary code word exceeds a predetermined error threshold.

In another aspect of the present invention the at least one transmitting modem includes a plurality of transmitting modems and the system further includes a demultiplexer intermediate the coder and the transmitting modems for demultiplexing the code words, thereby causing each of the transmitting modems to transmit a different portion of each of the code words.

In another aspect of the present invention the controller is operative to predict after determining that the number of errors detected in any of the portions exceeds the predetermined error threshold, and any of the predicted errors corresponds to the portion exceeding the predetermined error threshold.

In another aspect of the present invention the system further includes an interleaver intermediate the coder and the at least one transmitting modem for interleaving the code words, and a deinterleaver intermediate the at least one receiving modem and the decoder for deinterleaving the interleaved code words.

In another aspect of the present invention in a communications system including a data stream encoded into at least one outer code word, where the at least one outer code word is further encoded into at least one inner code word using either of an error correcting code and an error checking code, a forward error correction system is provided including an inner decoder operative to receive the inner code word, determine the validity of the inner code word, communicate the validity of the inner code word, and decode the inner code word, thereby reconstituting the outer code word, a controller operative to receive from the inner coder the communication of validity of the inner code word, map the inner code word to its corresponding position in the reconstituted outer code word, and, where the inner code word is invalid, and report the position as an erasure position, and an outer decoder operative to receive the reconstituted outer code word from the inner decoder and the erasure positions from the inner decoder, detect errors in the reconstituted outer code word, and correct any of the errors and erasures in the reconstituted outer code word.

In another aspect of the present invention the system further includes an outer coder operative to encode the data stream into the at least one outer code word, an inner coder operative to encode the outer code word into the at least one inner code word, and a communications channel for transmitting the inner code word to the inner decoder.

In another aspect of the present invention in a communications system including a data stream encoded into at least one primary code word and at least one secondary code word, where each primary code word is encoded at a first code rate, and each seconday code word is encoded at a second code rate that is greater than the first code rate, a forward error correction method is provided including detecting any errors in any of the transmitted code words, predicting from any of the errors in the primary code word at least one error in the secondary code word, and correcting any of the predicted errors as erasure positions in any of the secondary code words.

In another aspect of the present invention the predicting step includes predicting after determining that the number of errors detected in the primary code word exceeds a predetermined error threshold.

In another aspect of the present invention the method further includes coding the data stream at a coder, demultiplexing the code words into a plurality of code word portions, transmitting the portions via a plurality of transmitting modems, receiving the portions via a plurality of receiving modems, and multiplexing the plurality of portions, thereby reconstructing the code word.

In another aspect of the present invention the method further includes interleaving the code words prior to the transmitting step, and deinterleaving the interleaved code words subsequent to the transmitting step.

In another aspect of the present invention the method further includes configuring the decoder for decoding either of the primary and the secondary code words.

In another aspect of the present invention in a communications system including a data stream encoded into at least one primary code word and at least one secondary code word, where each primary code word is encoded at a first code rate, and each secondary code word is encoded at a second code rate that is greater than the first code rate, a forward error correction method is provided including detecting any errors in any of the primary code words at a primary decoder, predicting from any of the errors in the primary code word at least one error in the secondary code word, and correcting any of the predicted errors as erasures in the secondary code words at a secondary encoder.

In another aspect of the present invention the predicting step includes predicting after determining that the number of errors detected in the primary code word exceeds a predetermined error threshold.

In another aspect of the present invention the method further includes coding the data stream at a coder, demultiplexing the code words into a plurality of code word portions, transmitting the portions via a plurality of transmitting modems, receiving the portions via a plurality of receiving modems, and multiplexing the plurality of portions, thereby reconstructing the code word.

In another aspect of the present invention the method further includes interleaving the code words prior to the transmitting step, and deinterleaving the interleaved code words subsequent to the transmitting step.

In another aspect of the present invention in a communications system including a data stream encoded into at least one code word at a first code rate, the code word transmitted in a plurality of portions, a forward error correction method is provided including receiving a different one of the plurality of portions via a plurality of receiving modems, multiplexing the plurality of portions, thereby reconstructing the code words, determining the function status of any of the modems, and where any of the modems is functioning improperly, correcting as erasures the portion transmitted by the improperly functioning modem.

In another aspect of the present invention in a communications method including a data stream encoded into at least one outer code word, where the at least one outer code word is further encoded into at least one inner code word using either of an error correcting code and an error checking code, a forward error correction method is provided including determining the validity of the transmitted inner code word, firstly decoding the inner code word, thereby reconstituting the outer code word, mapping the inner code word to its corresponding position in the reconstituted outer code word, and where the inner code word is invalid, secondly decoding the reconstituted outer code word where the position is treated as an erasure position.

In another aspect of the present invention the method further includes firstly coding using Reed-Solomon coding and where the secondly decoding step includes decoding using Reed-Solomon decoding.

In another aspect of the present invention the secondly coding step includes coding using Trellis Coded Modulation coding and the firstly decoding step includes decoding using Trellis Coded Modulation decoding.

In another aspect of the present invention the secondly coding step includes coding using Cyclic Redundancy Check coding and the firstly decoding step includes decoding using Cyclic Redundancy Check decoding.

It is appreciated throughout the specification and claims that references to code words having a data portion and a redundancy portion may be understood as either referring to distinct data and redundancy portions common to systematic coding techniques, or indistinct, co-mingled portions common to non-systematic and convolutional coding techniques. It is further appreciated throughout the specification and claims that references to elements of the invention "reporting" information to other elements of the invention refers to the providing of information through notifications, indications, signals, or any other suitable communication technique known in the art.

The disclosures of all patents, patent applications, and other publications mentioned in this specification and of the patents, patent applications, and other publications cited therein are hereby incorporated by reference.

BRIEF DESCRIPTION OF THE DRAWINGS

The present invention will be understood and appreciated more fully from the following detailed description taken in conjunction with the appended drawings in which FIGS. 1–5, taken separately, are simplified block-flow diagrams of a forward error correction system, each constructed and operative in accordance with a different preferred embodiment of the present invention.

DETAILED DESCRIPTION OF PREFERRED EMBODIMENTS

Figure 1:
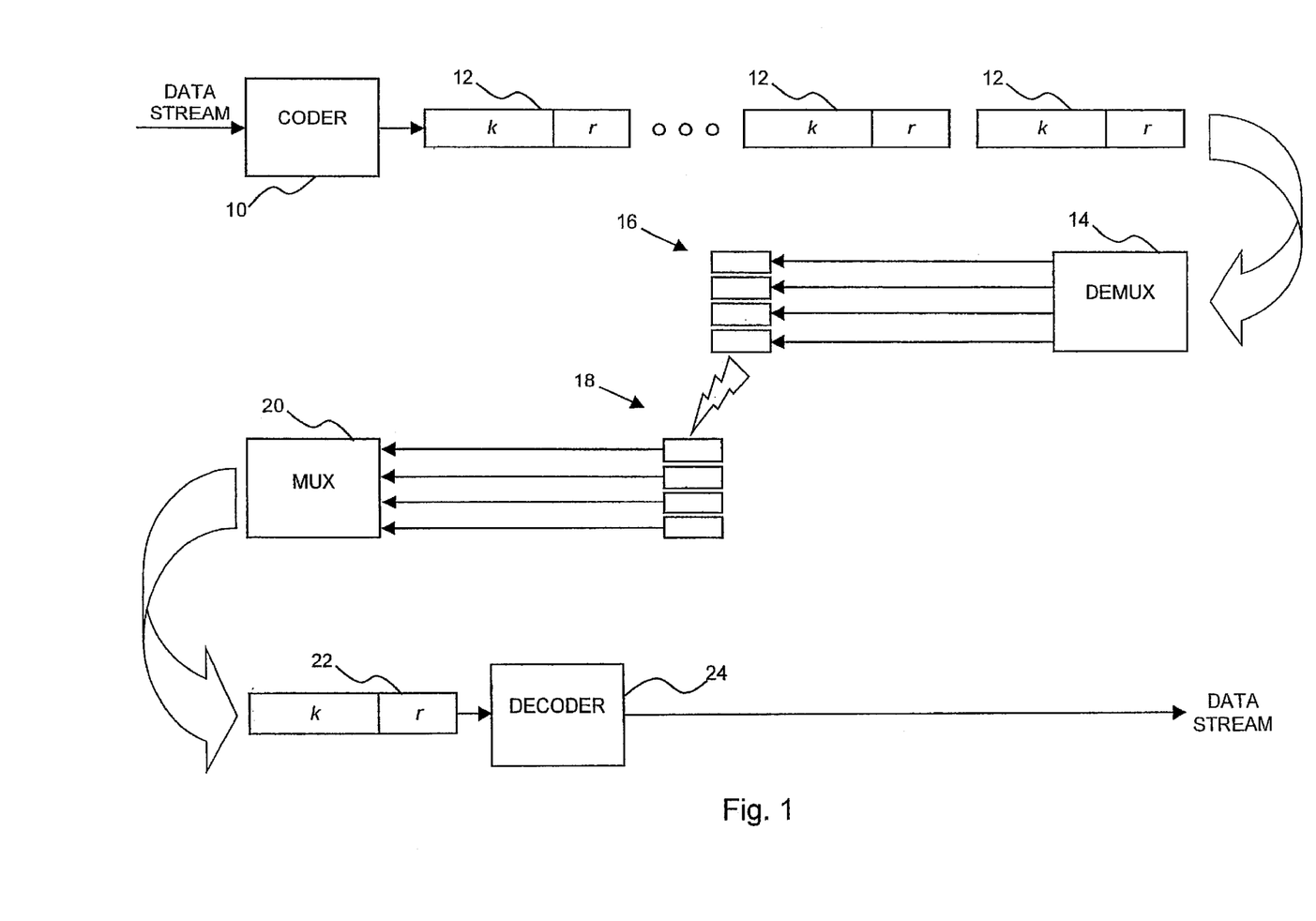

Reference is now made to FIG. 1 which is a simplified block-flow diagram of a forward error correction system, constructed and operative in accordance with a preferred embodiment of the present invention. In the system of FIG. 1 a data stream is encoded at a coder 10, such as a Reed-Solomon coder, into one or more code words 12, each typically having a data portion k and a redundancy portion r. The code words 12 are then demultiplexed at a demultiplexer 14 for parallel transmission via a plurality of modems in a modem pool 16, where each modem preferably transmits a different portion of each code word 12. The transmissions are then received by a plurality of modems in a modem pool 18, and multiplexed at a multiplexer 20 into reconstituted code words 22 that correspond to code words 12. Code words 22 are then decoded at a decoder 24.

Redundancy portion r preferably provides sufficient redundancy to allow correction of a predetermined number of errors. Preferably, redundancy portion r comprises sufficient redundancy to allow the system to recover from a failure of a predetermined number of modems in either of modem pools 16 and 18. For example, if modem pool 16 numbers ten modems, all having the same transmission rate, and the design goal is to configure the system to recover from a failure of one of the modems in modem pool 16, then the redundancy portion r in each code word should comprise at least 20% of the code word length, thus providing a code rate of 0.8.

Figure 2:
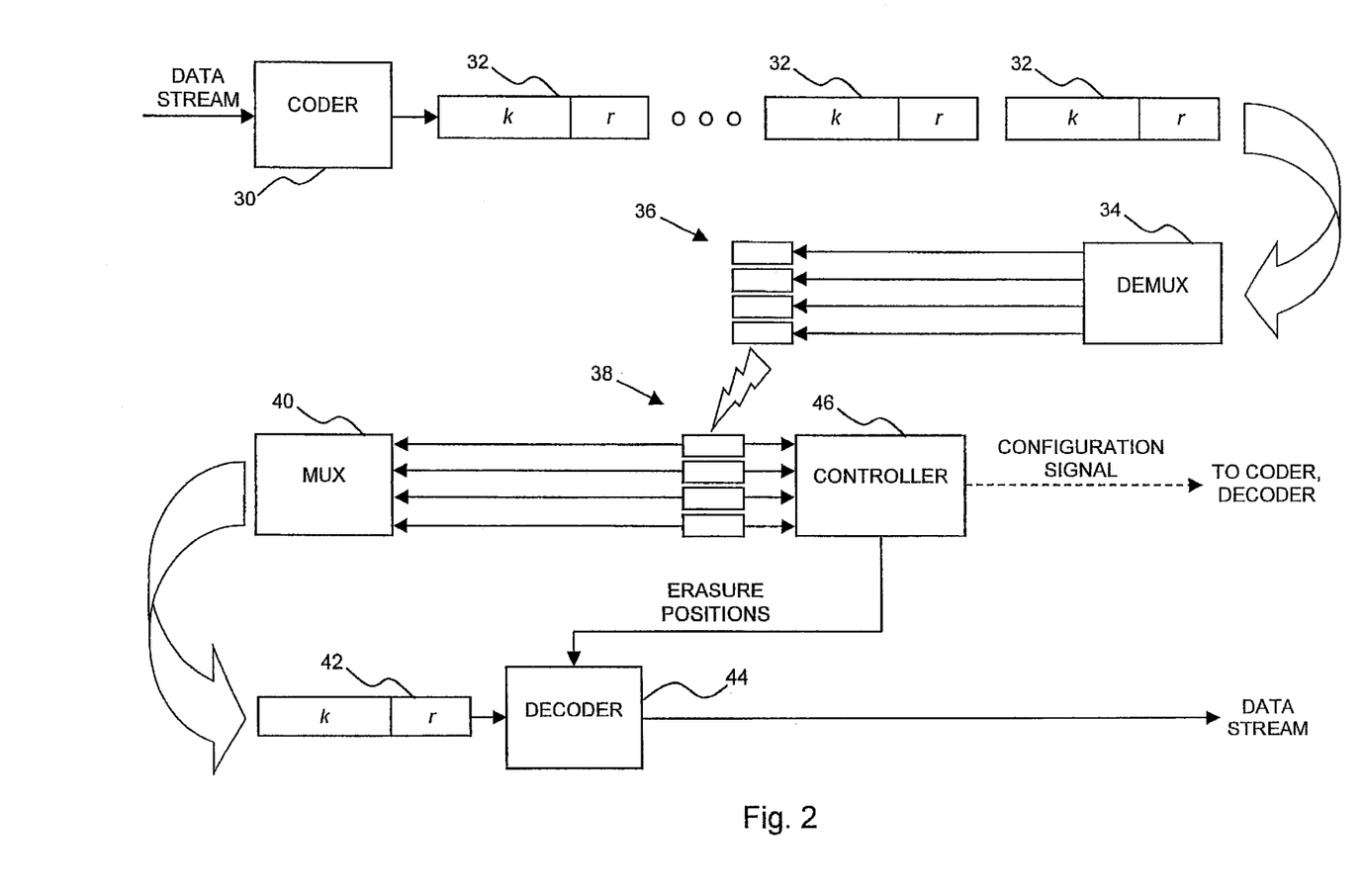

Reference is now made to FIG. 2 which is a simplified block-flow diagram of a forward error correction system, constructed and operative in accordance with a preferred embodiment of the present invention. In the system of FIG. 2 a data stream is encoded at a coder 30, such as a Reed-Solomon coder, into one or more code words 32, each typically having a data portion k and a redundancy portion r. The code words 32 are then demultiplexed at a demultiplexer 34 for parallel transmission via a plurality of modems in a modem pool 36, where each modem preferably transmits a different portion of each code word 32. The transmissions are then received by a plurality of modems in a modem pool 38, and multiplexed at a multiplexer 40 into reconstituted code words 42 that correspond to code words 32. Code words 42 are then decoded at a decoder 44.

Each modem in modem pool 38 is preferably able to determine whether or not it is functioning properly using conventional techniques, such as through the detection of a received power signal or synchronization word, and preferably sends a status signal to a controller 46 indicating such. Upon receiving notification of a malfunctioning modem, controller 46 informs decoder 44 that those portions of the code words transmitted by the malfunctioning modem are to be treated as erasures and sends a signal indicating their positions to decoder 44. Controller 46 may optionally send a configuration signal to both encoder 30 and decoder 44 to change the coding parameters to accommodate the number of errors and erasures encountered by increasing or decreasing the amount of redundancy in the code words.

Referring again to the example given above of a modem pool comprising ten modems with the design goal of maintaining operation where one modem fails, if the communication channel can tolerate bursts of errors for a relatively short period of time, the code rate of the system of FIG. 2 may be increased from 0.8 to 0.9, and the system will recover from a failure of one modem by marking the positions of those symbols which were to be transmitted via the malfunctioning modem as erasures.

Figure 3:
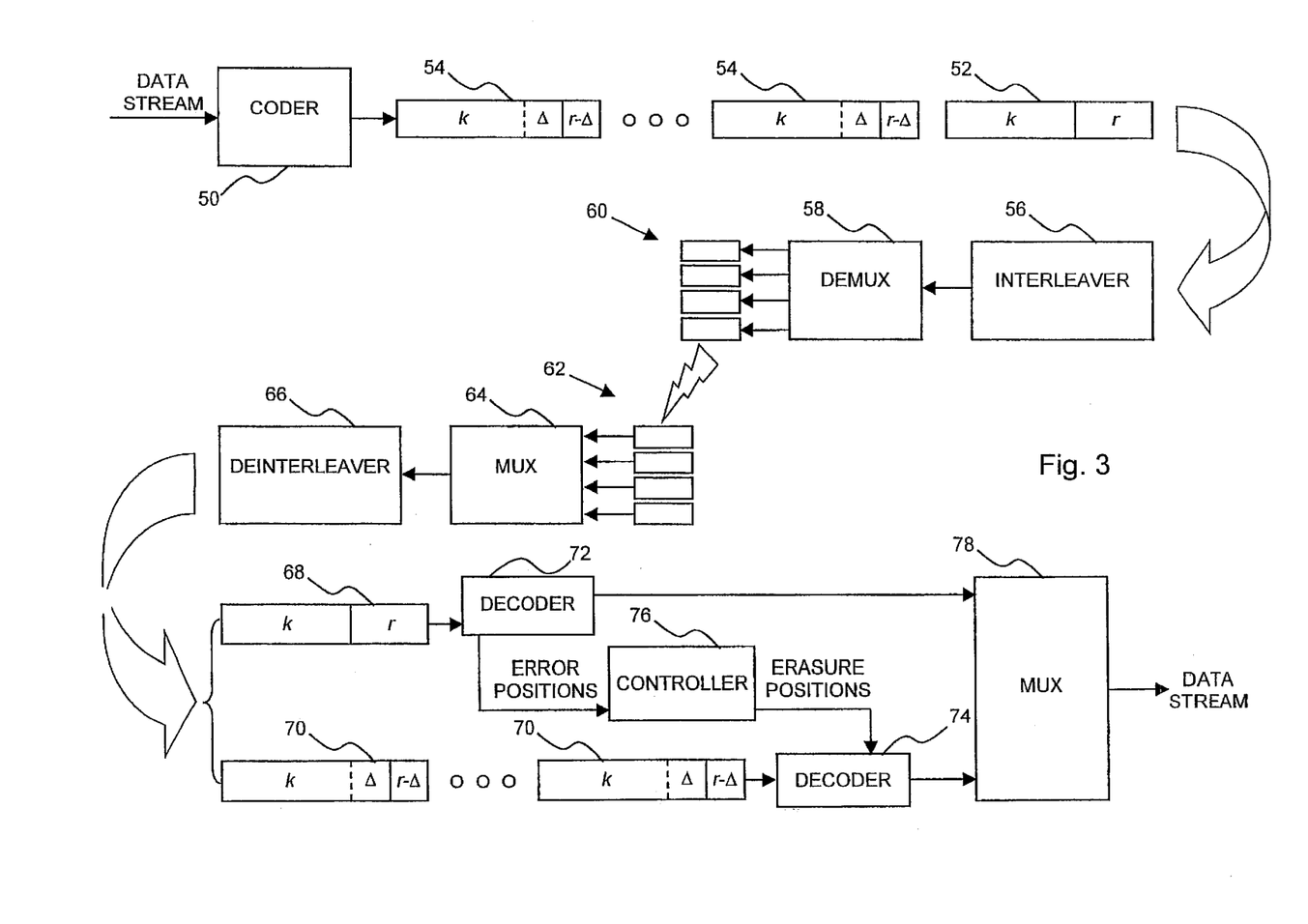

Reference is now made to FIG. 3 which is a simplified block-flow diagram of a forward error correction system, constructed and operative in accordance with a preferred embodiment of the present invention. In the system of FIG. 3 a data stream is encoded at a coder 50, typically a Reed-Solomon coder, into one or more primary code words 52 and one or more secondary code words 54. Although code words 52 and 54 are shown as having the same code word length and are represented using systematic encoding, where the data and redundancy portions are not intermingled, it is appreciated that code words 52 and 54 may use either systematic or non-systematic encoding and that their lengths may be different. Primary code word 52 typically comprises a data portion k and a redundancy portion r. Redundancy portion r preferably comprises sufficient redundancy to allow correction of a predetermined number of errors. Secondary code words 54 preferably comprise a redundancy portion r−Δ and a data portion Δ in addition to data portion k. Redundancy portion r−Δ preferably comprises sufficient redundancy to allow correction of a predetermined number of erasures, and may therefore be up to half as large as redundancy portion r of primary code word 52. The size of data portion Δ preferably corresponds to the reduction in size of redundancy portion r−Δ as compared to redundancy portion r of primary code words 52.

The primary and secondary code words 52 and 54 are then preferably interleaved in accordance with conventional techniques at an interleaver 56 and demultiplexed at a demultiplexer 58 for parallel transmission via one or more modems in a modem pool 60, where each modem preferably transmits a different portion of each code word.

At the receiving end the demultiplexed code word portions are received by modems in a modem pool 62, multiplexed back into interleaved code words at a multiplexer 64, and deinterleaved at a deinterleaver 66 into primary and secondary code words 68 and 70 corresponding to primary and secondary code words 52 and 54. Primary code word 68 is then preferably fed into a primary decoder 72 which detects and corrects any errors in primary code word 68. The position of any errors found in primary code word 68 are provided to a controller 76 which is preferably configured to predict which positions in the secondary code words are vulnerable to errors and mark these positions as erasures. For example, controller 76 may be configured to determine whether the number of errors detected in a code word portion received via a particular modem exceeds a predetermined error threshold. If the threshold is exceeded, then the modem and/or its connection is deemed to be unreliable, and each position in the code word portions subsequently received therefrom are treated as erasures. The erasure positions are then communicated from controller 76 to a secondary decoder 74. Secondary code words 70 are then fed into secondary decoder 74 which decodes the secondary code words 70 and corrects for the erasures indicated by controller 76. The decoded output from primary and secondary decoders 72 and 74 are then preferably fed to a multiplexer 78, thus reconstructing the original data stream. Processing preferably continues in a cyclical manner, with primary code words followed by secondary code words followed by primary code words, etc.

Referring again to the example given above of a modem pool comprising ten modems, each having the same transmission rate, a communication system employing the coding system of FIG. 3 with one primary code word having a code rate of 0.8 (20% redundancy) followed by four secondary code words having a code rate of 0.9 (10% redundancy) will provide good protection against a single modem failure with an overall code rate of 0.88 (12% redundancy).

Figure 4:
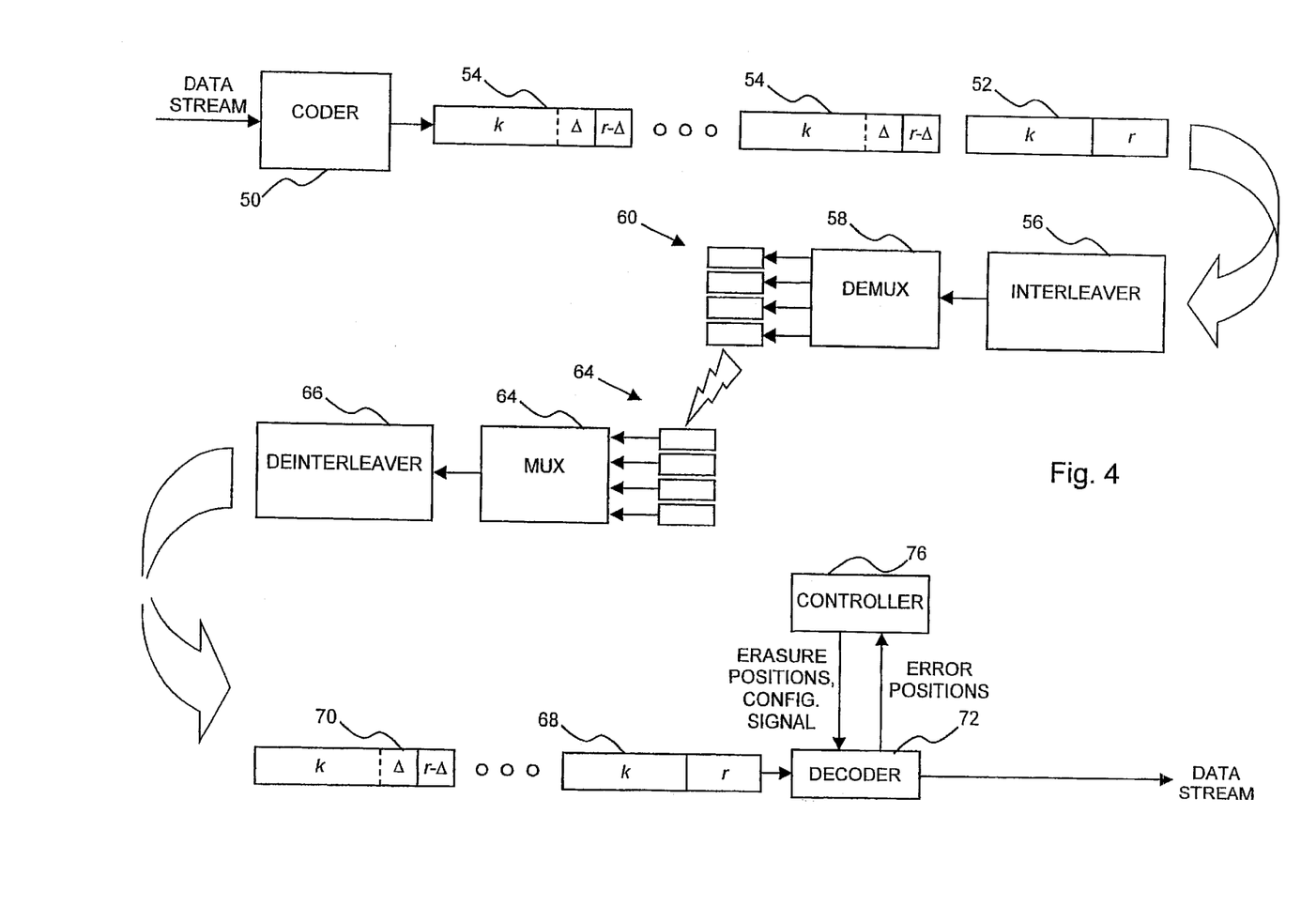

Reference is now made to FIG. 4 which is a simplified block-flow diagram of a forward error correction system, constructed and operative in accordance with a preferred embodiment of the present invention. The system of FIG. 4 is substantially similar to the system of FIG. 3 with the notable exception that primary decoder 72 is capable of decoding both primary and secondary code words 68 and 70 without the need for secondary decoder 74. In the present embodiment controller 76 indicates the erasure positions to primary decoder 72, and optionally may send a configuration signal to primary decoder 72 to change its decoding parameters accordingly in order to selectably decode both primary and secondary code words 68 and 70.

Figure 5:
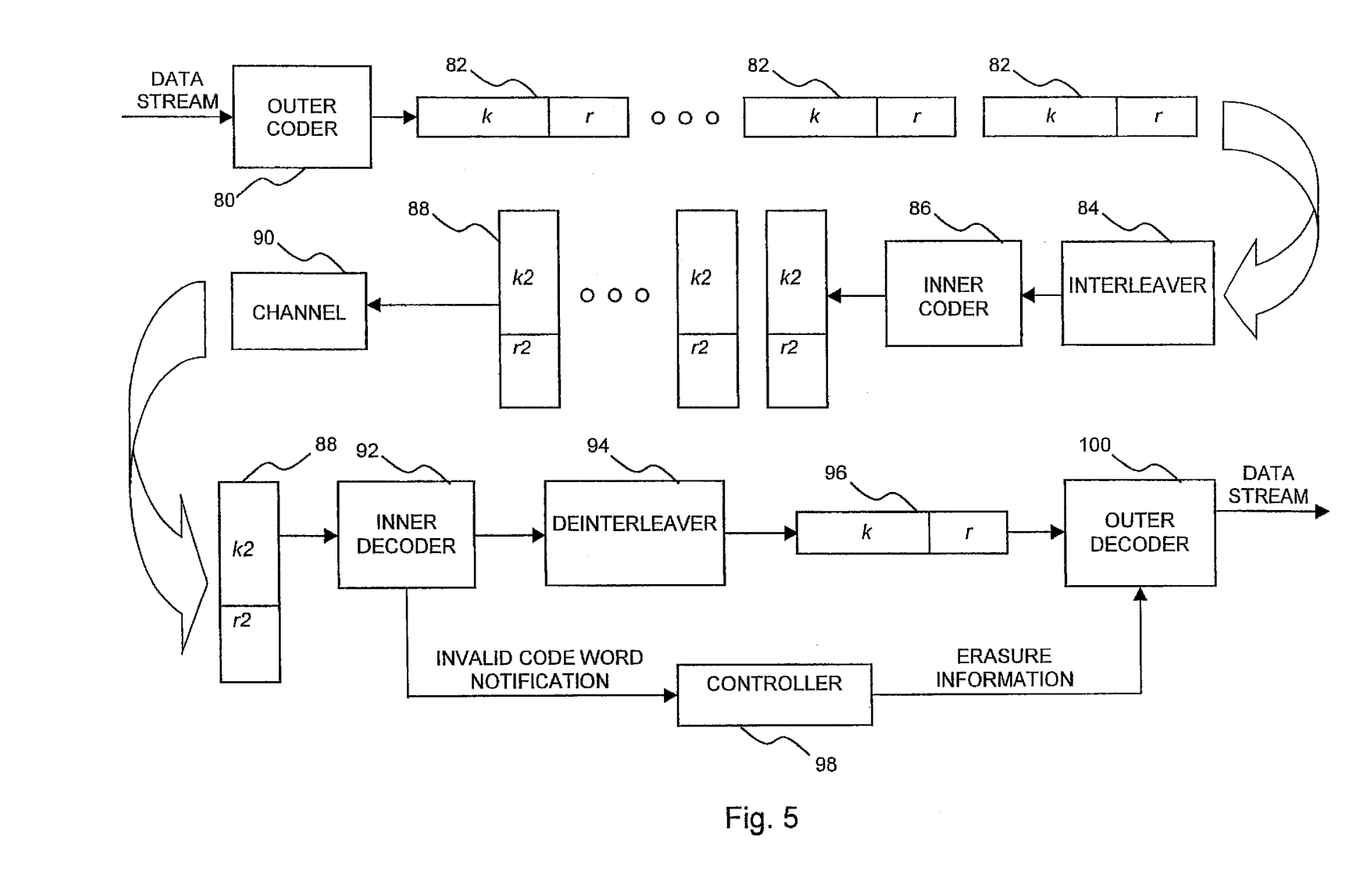

Reference is now made to FIG. 5 which is a simplified block-flow diagram of a forward error correction system, constructed and operative in accordance with a preferred embodiment of the present invention. In the system of FIG. 5 a data stream is encoded at a outer coder 80, such as a Reed-Solomon coder, into one or more outer code words 82, each typically having a data portion k and a redundancy portion r. Typically, outer code words 82 are then interleaved at an interleaver 84 and coded at a inner coder 86 into one or more inner code words 88. Inner coder 86 may employ an error correcting code, such as Trellis Coded Modulation (TCM), or an error checking code, such as Cyclic Redundancy Checking (CRC) Inner code words 88 are then transmitted via a communications channel 90, which may include one or more modems or any other transmission medium.

At the receiving end of communications channel 90, the transmission is decoded at an inner decoder 92, whose decoding method corresponds to the coding method used by inner coder 86, and deinterleaved at a deinterleaver 94 to form reconstituted outer code words 96 that correspond to outer code words 82. Inner decoder 92 preferably checks whether inner code words 88 are valid code words in accordance with the employed error correcting code. Inner decoder 92 notifies a controller 98 of each inner code word 88 that is found to be invalid. Controller 98 in turn maps the positions of each invalid code word 88 to its corresponding position in outer code word 96 and marks the position as an erasure. Controller 98 then communicates the positions of the erasures to an outer decoder 100, whose decoding method corresponds to the coding method used by outer coder 80, which then decodes the outer code words 96 into the original data stream.

In an exemplary implementation of the system of FIG. 5 outer coder 80 employs a RS code, where each symbol of the RS code is a byte, 8 bits in length. Thus, each code word of the RS code will contain k+r bytes or 8(k+r) bits. Inner coder 86 adds a parity check bit to each byte of the RS code words, thus forming inner code words 88, 9 bits in length, where k2=8 bits and r2=1 bit. In this example, each k bytes of data of each outer code word 82 would be coded into 9(k+r) bits. At the receiver, each 9-bit inner code word 88 is checked for parity. If parity is violated, the corresponding byte of the reconstituted outer code word 96 comprising the 8 data bits of the inner code word 88 is marked as an erasure.

The system of FIG. 5 demonstrates that whenever a concatenated coding scheme is used, such as Reed-Solomon/Vitterbi in ADSL systems, the inner decoder may be used to mark erasures and thereby improve the performance of the outer decoder.

Although the present invention has been described with respect to RS encoding, it is appreciated that the present invention may easily be implemented for use with other codes, including block codes and convolutional codes. The present invention is also applicable to codes employing soft decisions where erasures are designated by assigning 1 to the ratio $pr_b(1)/pr_b(0)$ (or 0 to $\log(pr_b(1)/pr_b(0))$) for a bit to be erased, where $pr_b(0)$ denotes the a priori probability that bit b is 0, and $pr_b(1)$ denotes the a priori probability that bit b is 1. It is further appreciated that any conventional error location mechanism may be used.

It is appreciated that one or more of the steps of any of the methods described herein may be omitted or carried out in a different order than that shown, without departing from the true spirit and scope of the invention.

While the methods and apparatus disclosed herein may or may not have been described with reference to specific hardware or software, the methods and apparatus have been described in a manner sufficient to enable persons of ordinary skill in the art to readily adapt commercially available hardware and software as may be needed to reduce any of the embodiments of the present invention to practice without undue experimentation and using conventional techniques.

While the present invention has been described with reference to a few specific embodiments, the description is intended to be illustrative of the invention as a whole and is not to be construed as limiting the invention to the embodiments shown. It is appreciated that various modifications may occur to those skilled in the art that, while not specifically shown herein, are nevertheless within the true spirit and scope of the invention.

What is claimed is:

1. A forward error correction system comprising:
    a coder operative to encode a data stream into at least one primary code word and at least one secondary code word, wherein:
        each primary code word is encoded at a first code rate, and
        each secondary code word is encoded at a second code rate that is greater than said first code rate,
    a plurality of transmitting modems for transmitting said code words; and
    a demultiplexer intermediate to said coder and said transmitting modems for demultiplexing said code words, thereby causing each of said transmitting modems to transmit a different portion of each of said code words.

2. A system according to claim 1 and further comprising:
    a plurality of receiving modems for receiving said different portions of each of said code words;
    a multiplexer for multiplexing said portions, thereby reconstructing said code words;
    a decoder operative to detect errors in any of said code words, correct any of said errors and erasures in said code words, and communicate the positions of any of said errors; and
    a controller operative to receive said communication of said error positions, predict from any of said errors in said primary code word at least one error in said secondary code word, and report any of said predicted errors as erasure positions to said decoder, wherein said controller is operative to predict after determining that the number of errors detected in said primary code word exceeds a predetermined error threshold.

3. A system according to claim 2 wherein said controller is operative to predict after determining that the number of errors detected in any of said portions exceeds said predetermined error threshold, and wherein any of said predicted errors corresponds to said portion exceeding said predetermined error threshold.

4. A system according to claim 2 wherein said controller is operative to send a configuration signal to said decoder configuring said decoder for decoding either of said primary and said secondary code words.

5. A forward error correction system comprising:
    a coder operative to encode a data stream into at least one primary code word and at least one secondary code word, wherein:
        each primary code word is encoded at a first code rate, and
        each secondary code word is encoded at a second code rate that is greater than said first code rate,
    a demultiplexer for demultiplexing each of said code words into a plurality of portions;
    a plurality of transmitting modems, each transmitting modem for transmitting at least one of said plurality of portions;
    a plurality of receiving modems for receiving said plurality of portions;
    a multiplexer for multiplexing said plurality of portions, thereby reconstructing said code words;
    a primary decoder operative to detect any errors in any of said primary code words, correct any of said errors, and communicate the positions of any of said errors;
    a controller operative to receive said communication of said error positions, predict from any of said errors in said primary code word at least one error in said secondary code word, and report any of said predicted errors as erasure positions;
    a secondary decoder operative to receive said report of erasure positions and correct any of said erasures in said secondary code words.

6. A system according to claim 5 wherein said controller is operative to predict after determining that the number of errors detected in said primary code word exceeds a predetermined error threshold.

7. A system according to claim 5 wherein said controller is operative to predict after determining that the number of errors detected in any of said portions exceeds said predetermined error threshold, and wherein any of said predicted errors corresponds to said portion exceeding said predetermined error threshold.

8. A forward error correction system comprising:
   a coder operative to encode a data stream into at least one code word at a first code rate;
   a demultiplexer for demultiplexing said code word into a plurality of portions;
   a plurality of transmitting modems, each transmitting modem for transmitting at least one of said plurality of portions;
   a plurality of receiving modems for receiving said plurality of portions, wherein any of said modems is operative to determine its function status and transmit a signal indicating said status;
   a multiplexer for multiplexing said plurality of portions, thereby reconstructing said code word;
   a decoder operative to detect any errors in said code word, correct any of said errors, and correct erasures; and
   a controller operative to receive said signal and, where said signal indicates that any of said modems is functioning improperly, report erasure positions corresponding to said portion transmitted by said improperly functioning modem to said decoder, wherein said decoder is operative to receive said report of erasure positions and correct any of said erasures in any of said code words.

9. A system according to claim 8 wherein said controller is operative to instruct said encoder to encode and said decoder to decode at a second code rate having a redundancy to accommodate the number of said errors and erasures.

10. A forward error correction method comprising:
    encoding a data stream into at least one primary code word and at least one secondary code word, wherein:
       each primary code word is encoded at a first code rate, and
       each secondary code word is encoded at a second code rate that is greater than said first code rate,
    demultiplexing said code words into a plurality of code word portions;
    transmitting said portions via a plurality of transmitting modems;
    receiving said portions via a plurality of receiving modems;
    multiplexing said plurality of portions, thereby reconstructing said code word;
    detecting any errors in any of said transmitted code words;
    predicting from any of said errors in said primary code word at least one error in said secondary code word; and
    correcting any of said predicted errors as erasure positions in any of said secondary code words.

11. A method according to claim 10 wherein said predicting step comprises predicting after determining that the number of errors detected in said primary code word exceeds a predetermined error threshold.

12. A method according to claim 10 and further comprising configuring said decoder for decoding either of said primary and said secondary code words.

13. A forward error correction method comprising:
    encoding a data stream into at least one primary code word and at least one secondary code word, wherein:
       each primary code word is encoded at a first code rate, and
       each secondary code word is encoded at a second code rate that is greater than said first code rate,
    demultiplexing each of said code words into a plurality of portions;
    transmitting said plurality of portions via a plurality of transmitting modems;
    receiving said plurality of portions via a plurality of receiving modems;
    multiplexing said plurality of portions, thereby reconstructing said code words;
    detecting any errors in any of said primary code words at a primary decoder;
    predicting from any of said errors in said primary code word at least one error in said secondary code word; and
    correcting any of said predicted errors as erasures in said secondary code words at a secondary encoder.

14. A method according to claim 13 wherein said predicting step comprises predicting after determining that the number of errors detected in said primary code word exceeds a predetermined error threshold.

15. A method according to claim 13 wherein said predicting step comprises predicting said at least one error in said secondary code word after determining that the number of errors detected in any of said portions exceeds a predetermined error threshold, and wherein any of said predicted errors corresponds to said portion exceeding said predetermined error threshold.

16. A forward error correction method comprising:
    encoding a data stream into at least one code word at a first code rate;
    demultiplexing each of said code words into a plurality of portions;
    transmitting said plurality of portions via a plurality of transmitting modems;
    receiving said plurality of portions via a plurality of receiving modems;
    multiplexing said plurality of portions, thereby reconstructing said code words;
    determining the function status of any of said modems; and
    where any of said modems is functioning improperly, correcting as erasures said portion transmitted by said improperly functioning modem.

17. In a communications system including a data stream encoded into at least one primary code word and at least one secondary code word, wherein each primary code word is encoded at a first code rate and each secondary code word is encoded at a second code rate that is greater than said first code rate, a forward error correction system comprising:
    a plurality of receiving modems for receiving different portions of each of said code words;
    a multiplexer for multiplexing said portions, thereby reconstructing said code words;
    a decoder operative to receive said code words, detect errors in any of said code words, correct any of said errors and erasures in said code words, and communicate the positions of any of said errors; and a controller operative to receive said communication of said error positions, predict from any of said errors in said primary code word at least one error in said secondary code word, and report any of said predicted errors as erasure positions to said decoder.

18. A system according to claim 17 and further comprising a coder operative to encode said data stream.

19. A system according to claim 18 and further comprising a plurality of transmitting modems and a demultiplexer intermediate to said coder and said transmitting modems for demultiplexing said code words prior to transmission, thereby causing each of said transmitting modems to transmit a different portion of each of said code words.

20. A system according to claim 19 wherein said controller is operative to predict after determining that the number of errors detected in any of said portions exceeds said predetermined error threshold, and wherein any of said predicted errors corresponds to said portion exceeding said predetermined error threshold.

21. A system according to claim 17 wherein said controller is operative to predict said at least one error in said secondary code word after determining that the number of errors detected in said primary code word exceeds a predetermined error threshold.

22. A system according to claim 17 wherein said controller is operative to send a configuration signal to said decoder configuring said decoder for decoding either of said primary and said secondary code words.

23. In a communications system including a data stream encoded into at least one primary code word and at least one secondary code word, wherein each primary code word is encoded at a first code rate, and each secondary code word is encoded at a second code rate that is greater than said first code rate, a forward error correction system comprising:

a plurality of receiving modems for receiving different portions of each of said code words;

a multiplexer for multiplexing said portions, thereby reconstructing said code words;

a primary decoder operative to receive said primary code words, detect any errors in any of said primary code words, correct any of said errors, and communicate the positions of any of said errors;

a controller operative to receive said communication of said error positions, predict from any of said errors in said primary code word at least one error in said secondary code word, and report any of said predicted errors as erasure positions; and a secondary decoder operative to receive said report of erasure positions and correct any of said erasures in said secondary code words.

24. A system according to claim 23 and further comprising a coder operative to encode said data stream.

25. A system according to claim 24 and further comprising a plurality of transmitting modems and a demultiplexer intermediate said coder and said transmitting modems for demultiplexing said code words prior to transmission, thereby causing each of said transmitting modems to transmit a different portion of each of said code words.

26. A system according to claim 25 wherein said controller is operative to predict after determining that the number of errors detected in any of said portions exceeds said predetermined error threshold, and wherein any of said predicted errors corresponds to said portion exceeding said predetermined error threshold.

27. A system according to claim 23 wherein said controller is operative to predict after determining that the number of errors detected in said primary code word exceeds a predetermined error threshold.

28. In a communications system including a data stream encoded into at least one code word at a first code rate, said code word transmitted in a plurality of portions, a forward error correction system comprising:

a plurality of receiving modems for receiving said plurality of portions, wherein any of said modems is operative to determine its function status and transmit a signal indicating said status;

a multiplexer for multiplexing said plurality of portions, thereby reconstructing said code word;

a decoder operative to detect any errors in said code word, correct any of said errors, and correct erasures; and a controller operative to receive said signal and, where said signal indicates that any of said modems is functioning improperly, report erasure positions corresponding to said portion transmitted by said improperly functioning modem to said decoder, wherein said decoder is operative to receive said report of erasure positions and correct any of said erasures in any of said code words.

29. A system according to claim 28 and further comprising a coder operative to encode said data stream.

30. A system according to claim 29 wherein said controller is operative to instruct said encoder to encode and said decoder to decode at a second code rate having a redundancy to accommodate the number of said errors and erasures.

31. A system according to claim 29 and further comprising a plurality of transmitting modems and a demultiplexer intermediate said coder and said transmitting modems for demultiplexing said code words prior to transmission, thereby causing each of said transmitting modems to transmit a different portion of each of said code words.

32. In a communications system including a data stream encoded into at least one primary code word and at least one secondary code word, wherein each primary code word is encoded at a first code rate, and each secondary code word is encoded at a second code rate that is greater than said first code rate, a forward error correction method comprising:

coding said data stream at a coder;

demultiplexing said code words into a plurality of code word portions;

transmitting said portions via a plurality of transmitting modems;

receiving said portions via a plurality of receiving modems;

multiplexing said plurality of portions, thereby reconstructing said code word;

detecting any errors in any of said transmitted code words;

predicting from any of said errors in said primary code word at least one error in said secondary code word; and correcting any of said predicted errors as erasure positions in any of said secondary code words.

33. A method according to claim 32 wherein said predicting step comprises predicting after determining that the number of errors detected in said primary code word exceeds a predetermined error threshold.

34. A method according to claim 32 and further comprising configuring said decoder for decoding either of said primary and said secondary code words.

35. In a communications system including a data stream encoded into at least one primary code word and at least one secondary code word, wherein each primary code word is encoded at a first code rate, and each secondary code word is encoded at a second code rate that is greater than said first code rate, a forward error correction method comprising:

coding said data stream at a coder;

demultiplexing said code words into a plurality of code word portions;

transmitting said portions via a plurality of transmitting modems;

receiving said portions via a plurality of receiving modems;

multiplexing said plurality of portions, thereby reconstructing said code word;

detecting any errors in any of said primary code words at a primary decoder;

predicting from any of said errors in said primary code word at least one error in said secondary code word; and correcting any of said predicted errors as erasures in said secondary code words at a secondary encoder.

36. A method according to claim 35 wherein said predicting step comprises predicting after determining that the number of errors detected in said primary code word exceeds a predetermined error threshold.

37. In a communications system including a data stream encoded into at least one code word at a first code rate, said code word transmitted in a plurality of portions, a forward error correction method comprising:

receiving said plurality of portions via a plurality of receiving modems;

multiplexing said plurality of portions, thereby reconstructing said code words;

determining the function status of any of said modems; and where any of said modems is functioning improperly, correcting as erasures said portion transmitted by said improperly functioning modem.

* * * * *